United States Patent [19]

Ueno

[11] Patent Number: 4,980,750
[45] Date of Patent: Dec. 25, 1990

[54] SEMICONDUCTOR CRYSTAL

[75] Inventor: Kazuyoshi Ueno, Tokyo, Japan

[73] Assignee: NEC Corporation, Tokyo, Japan

[21] Appl. No.: 291,646

[22] Filed: Dec. 29, 1988

[30] Foreign Application Priority Data

Dec. 29, 1987 [JP] Japan ............................. 62-336036
Dec. 29, 1987 [JP] Japan ............................. 62-336039
Dec. 29, 1987 [JP] Japan ............................. 62-336040

[51] Int. Cl.$^5$ ............................................. H01L 29/04
[52] U.S. Cl. ........................................ 357/60; 357/4; 357/16; 357/22
[58] Field of Search ................. 357/22 I, 22 L, 22 A, 357/22 MD, 4, 60, 4 SL, 16

[56] References Cited

U.S. PATENT DOCUMENTS

| | | | |
|---|---|---|---|
| 3,146,137 | 8/1964 | Williams | 357/60 |
| 3,209,215 | 9/1965 | Esaki | 357/60 |
| 3,764,424 | 10/1973 | Sayko | 357/60 |
| 4,205,329 | 5/1980 | Dingle et al. | 357/4 |
| 4,261,771 | 4/1981 | Dingle et al. | 357/4 |
| 4,603,340 | 7/1986 | Dil | 357/4 |
| 4,605,945 | 8/1986 | Katayama et al. | 357/22 A |
| 4,675,708 | 6/1987 | Onabe | 357/16 |
| 4,807,001 | 2/1989 | Hida | 357/22 A |
| 4,835,583 | 5/1989 | Morioka et al. | 357/4 |

FOREIGN PATENT DOCUMENTS

| | | | |
|---|---|---|---|
| 60-176276 | 9/1985 | Japan | 357/22 |
| 0051266 | 3/1987 | Japan | 357/22 MD |

OTHER PUBLICATIONS

"Metalorganic Chemical . . . Superlattices", Roentgen et al., May 1st 1985, J. Appl. Phys. 58 (4).
"Role of the Piezoelectric Effect in Device Uniformity of GaAs Integrated Circuits", Chang et al., Applied Physics Letters 45(3), pp. 279–281, (Aug. 1, 1984).
"Comparison of the Orientation Effect of $SiO_2$— and $Si_3N_4$— Encapsulated GaAs MESFET's", Ohnishi et al., IEEE Electron Device Letters, vol. EDL-6, No. 4, pp. 172–174, (Apr. 1985).
"Piezoelectric Effects in GaAs FET's and Their Role In Orientation-Dependent Device Characteristics", Asbeck et al., IEEE Transactions of Electron Devices, vol. ED-31, No. 10, pp. 1377–1380 (Oct. 1984).
"Improvement in GaAs MESFET Performance Due to Peizoelectric Effect", Onodera et al., IEEE Transactions on Electronic Devices, vol. ED-32, No. 11, pp. 2314–2318 (Nov. 1985).

Primary Examiner—Rolf Hille
Assistant Examiner—Minh Loan Tran
Attorney, Agent, or Firm—Burns, Doane, Swecker & Mathis

[57] ABSTRACT

A novel structure of semiconductor crystal of compound semiconductor material has a plurality of unit layers stratified periodically on a substrate. Each unit layer comprises at least one first semiconductor layer consisting of a first atom mono layer of a first element and a second atom mono layer of a second element, the first and second atom mono layers being stratified one over another alternately in a first deposition order, and at least one second semiconductor layer consisting of the first atom mono layer and the second atom mono layer which are stratified one over another alternately in the reverse deposition order with respect to the first deposition order of the first semiconductor layer.

10 Claims, 4 Drawing Sheets

SEMICONDUCTOR CRYSTAL

BACKGROUND OF THE INVENTION

1. Field of the Invention

The present invention relates to a novel structure of semiconductor crystals. More particularly, it relates to an improved structure of III-V compound semiconductors having controlled piezoelectric property. The semiconductor structure according to the present invention is useful for fabricating elements such as MESFET, IIBT, laser diodes or the like.

The present invention relates also to a process for producing such a novel structure of semiconductor crystals.

2. Description of the Related Art

III-V compound semiconductors having a zincblende type crystalline structure such as gallium arsenide (GaAs), indium phosphite (InP) or the like are used as a material for high-speed switching devices or high-frequency amplifying devices owing to their high electron mobility and as a material for light-emitting devices owing to their direct transition type band structure.

FIG. 1 illustrates an example of a well-known Schottky barrier type field-effect transistor fabricated on a GaAs substrate. In the GaAsMESFET, an active channel layer 24 is formed by ion implantation technique or the like on a semi-insulating GaAs (100) substrate 14 which is sliced out of an ingot which is prepared by the Czochralski technique. A gate electrode 34, a source electrode 44 and a drain electrode 54 are formed and then a protective coating layer 64 made of insulator such as $SiO_2$ is deposited thereon.

In the conventional GaAs metal-semiconductor field effect transistor (MESFET) above-mentioned, elastic stresses are generated in the GaAs substrate because of difference in thermal expansion coefficient between the gate metal and the GaAs which has noncontrosymmetric and polar properties and because of the influence from the protective overlay and the ohmic electrodes. These stresses induce a charge due to the piezoelectric effect.

Such a charge induced by the piezoelectric effect causes a trouble in the uniformity of electrical characteristics of MESFETs fabricated, because the drain current of the MESFET drifts and/or the threshold voltage shifts. The charges induced by the piezoelectric effect arouse another problem of anisotropy that the electric characteristics depend on the orientation of the gate electrode of MESFET. This fact was reported by M. F. Chang et al. in "Appl. Physi. Lett." 45 (3) 1, Aug. 1984 p 279 and by T. Ohnishi et al. in "IEEE Electron Device Letters" Vol. EDL-6 No. 4, April 1985.

In the prior arts, in order to overcome these problems, it is proposed to select materials and thickness of the gate electrode and of the protective overlay in order to minimize the stresses (P. M. Asbeck et al. in "IEEE Transactions on Electron Devices" Vol. ED-31 No. 10, October, 1984). The selection of materials and thickness of the gate electrode and of the protective overlay is, however, limited. Therefore, there has been a strong demand to solve the problems much basically by changing the physical properties of the semiconductor materials themselves.

Technological trend in GaAsMESFET is to reduce the gate length so as to improve its performance. However, as the gate length is reduced, a so called short-channel effect appears so that leakage of electrons out of a channel region increases and the device characteristics of a short channel FET deviates from a device whose gate length is long. If a FET having such short-channel effect is built in an integrated circuit, the variation in the electrical characteristics become uncontrollable with respect to the variation in gate length but the device parameters are influenced directly by manufacturing conditions such as gate processing, so that it becomes difficult to design the circuits.

A method for controlling the short-channel effect to improve the performance of GaAsMESFET is reported by T. Onodera et al. in "IEEE Transaction on Electron devices" Vol. ED-32, No. 11, November 1985, p.2314. In this paper, the magnitude of stress exerted to the GaAs substrate caused by a protective dielectric overlay is modified by changing the thickness of the overlay in such manner that a piezoelectric charge which is desirable to improve the performance can be induced. However, application of this technique is limited because the thickness of the protective overlay and hence the stress induced by the protective overlay depend on the other factors such as wiring process or the like, so that the design flexibility is restricted in this technique.

Basic logic elements used in the GaAs integrated circuit built on a GaAs substrate are DCFL (Direct Coupled FET Logic), BFL (Buffered FET Logic), SCFL (Source Coupled FET Logic) or the like. Among them, DCFL and SCFL are fabricated by different FETs each having its own threshold voltage on a common substrate. In the prior art, when such different FETs are fabricated on a common substrate, it is necessary to prepare different n-type channels each having a different carrier density or a different thickness, so that a plurality of operations are required to prepare the different channels, with the result that the manufacturing process becomes intricate.

Japanese patent laid-open No. 60-176,276 utilizes the above-mentioned anisotropy or the piezoelectric charge in the fabrication of an integrated circuit. Namely, in this patent, two FETs having two different threshold voltages are built on a common substrate by changing the orientation of gate electrodes for respective channels each possessing an identical concentration and an identical thickness without increasing the channel forming steps.

However, the value of the piezoelectric charge which results in the difference between two threshold voltages is determined by a piezoelectric constant which is inherent in material of the substrate used if the magnitude of the stress applied to the substrate is constant, so that it is impossible to obtain controllably a desired value of the threshold voltage.

SUMMARY OF THE INVENTION

A main object of the present invention is to provide a novel semiconductor having a modified crystalline structure whose symmetrical property can be controlled arbitrarily.

A specific object of the present invention is to solve the fluctuation in quality of elements fabricated or lack of uniformity in the electric characteristics due to the piezoelectric effect and to provide a structure of semiconductor crystal which permits to realize semiconductor devices whose device properties are not influenced by the stresses.

Another specific object of the present invention is to provide a structure of semiconductor crystal which can induce a desired value of piezoelectric charge for a given constant thickness of the protective overlay by controlling the piezoelectric constant of the crystal itself.

Still another specific object of the present invention is to provide a structure of semiconductor crystal which permits to fabricate different FETs each having a desired threshold voltage for a common channel parameter possessing an identical concentration and an identical thickness by controlling the piezoelectric constant of the crystal itself.

The present invention provides a semiconductor crystal of compound semiconductor material composed of a first element and a second element, characterized in that a plurality of unit layers are stratified periodically on a substrate, each unit layer comprising at least one first semiconductor layer comprising a first atomic mono layer of the first element and a second atomic mono layer of the second element, the first and second atomic mono layers being stratified one over another alternately in a first deposition order, and at least one second semiconductor layer comprising said first atomic mono layer and the second atomic mono layer which are stratified one over another alternately in the reverse deposition order with respect to the first deposition order of the first semiconductor layer.

The semiconductor crystal according to the present invention is preferably grown or deposited on a substrate such as a semi-insulating GaAs substrate.

The semiconductor material of which the semiconductor crystal according to the present invention is composed is compound semiconductor. The compound semiconductor material is preferably composed of an element of III group and an element of V group, such as GaAs, InP, InAs, GaP, InGaAs or the like. And hence, each of the first semiconductor layer and the second semiconductor layer can be a GaAs layer, an InP layer, an InAs layer, a GaP layer, an InGaAs layer or the like.

The present invention is advantageously applicable to those semiconductor crystals having a zincblende type crystalline structure.

In preferred embodiments of the present invention, a semiconductor of GaAs is grown on a semi-insulating GaAs substrate. In the case of a ternary III-V compound semiconductor such as InGaAs, elements of III group such as In and Ga are deposited at a predetermined ratio of fluxes in place of a single flux of Ga.

A ratio of the total number of the first and second atomic mono layers in the first semiconductor layer to the total number of the first and second atomic mono layers in the second semiconductor layer can be changed continuously and selected according to the purpose or use.

According to the first aspect of the present invention, the total number of said first and second atomic mono layers in the first semiconductor layer is equal to the total number of the first and second atomic mono layers in the second semiconductor layer. In this case, the crystalline structure according to the present invention has such an advantage that the anisotropy caused by the polarization can be eliminated, so that, for example, the dependency of threshold voltage on the gate orientation caused by the piezoelectric effect due to the stress in GaAs MESFET can be eliminated and hence the freedom in design of integrated circuits is increased, and fluctuations of characteristics can be reduced so that uniformity in FET electrical characteristics is improved.

According to the second aspect of the present invention, the total number of the first and second atom mono layers in the first semiconductor layer is not equal to the total number of the first and second atom mono layers in the second semiconductor layer. In this case, the crystalline structure according to the present invention has such an advantage that the anisotropy caused by the polarization can be controlled intentionally, so that, for example, the short-channel effect can be controlled freely by means of the piezoelectric charges caused by the stress in GaAsMESFET in order to improve the performance and to increase the freedom in design of FET. The crystalline structure of this case advantageously permits to control the anisotropic effect caused by polarization continuously. For example, the freedom of design in GaAsMESFET which utilizes the piezoelectric effect caused by the stress is advantageously increased so that wo different threshold voltages each which depend on the difference in the orientation of respective gates can be realized freely.

Selection of the direction of stratification along which the unit layers are grown depends on material and purpose or use of the single crystal according to the present invention. In a preferred embodiment, the unit layers are grown or stratified periodically along a direction of [111] axis or [100] axis on the substrate.

In another preferred embodiment, an intermediate layer is interposed between the first semiconductor layer and the second semiconductor layer in order to facilitate growing an upper semiconductor layer. Each intermediate layer consists preferably of a plurality of atomic mono layers. In a preferred embodiment of the present invention for producing a GaAs semiconductor crystal, an intermediate layer of Ge is interposed between the first and second GaAs layers, because it is difficult to grow the second GaAs layer directly on the first GaAs layer. As a material of the intermediate layer, silicon (Si) can be used in place of the Ge.

The total number or thickness of the intermediate atomic mono layers stratified in the intermediate Ge layer is not necessary to be large. It is also possible to use another element in IV group other than Ge since it is not necessary to take the continuity in the lattice into consideration when the number of atomic mono layers used in the Ge layer is small. The total number of the atomic mono layers stratified in the Ge layer is preferably an even number in order to realize higher effect. Namely, when the number of the atomic mono layers stratified in the Ge layer is an odd number, a repetitive order of Ga and As and hence the polarity become identical both in the first GaAs layer and in the second GaAs layer, so that such system can be considered that several atomic mono layers in the first GaAs layer are merely replaced by Ge atomic mono layers stratified in the Ge layer is an even number, a repetitive order of Ga and As becomes reversed in the first GaAs layer and the second GaAs layer.

In the case of a ternary compound semiconductor such as InGaAs, elements of III group such as In and Ga are deposited at a predetermined ratio of fluxes in place of a single flux of Ga. In this case also, a layer of IV group element which has the same function as the intermediate Ge layer can be deposited.

The structure of the above mentioned semiconductor crystal according to the present invention can be produced by molecular beam epitaxy (MBE) technique which itself is well-known and widely used in the field of IC industry or the like.

Now, description will be made on several embodiments of the semiconductor crystal and a process for producing the same with reference to attached drawings.

FIRST PREFERRED EMBODIMENT

In the first embodiment of the semiconductor crystal which is provided by the first aspect of the present invention, the anisotropy caused by the polarization is eliminated. In this embodiment, the dependency of threshold voltage on the gate orientation is released from the piezoelectric effect due to the stress in GaAs MESFET, so that the design flexibility of integrated circuits is increased and the fluctuation of electric characteristics is reduced.

The principle on which the first embodiment of the present invention is based is that the polarity in GaAs is offset in each unit layer because polarization in the first semiconductor layer is directed to [111] while polarization in the second semiconductor layer is directed to [$\bar{1}\bar{1}\bar{1}$]. Therefore, the piezoelectric polarization due to polarity is offset or cancelled, so that the crystal obtained, as a whole, can be considered macroscopically to be a nonpolar crystal.

A semiconductor crystal according to the first embodiment has a structure in which each unit layer comprises a first semiconductor layer deposited on a substrate and consisting of at least one layer comprising alternately stratified III group atomic mono layer and V group atomic mono layer, the III group atomic and the V group atomic being components of a III-V compound semiconductor having a zincblende type crystal, and a second semiconductor layer deposited on the first semiconductor layer and consisting of at least one layer comprising alternately stratified III group atomic mono layer and V group atomic mono layer, the order of stratification of the III group atomic mono layer and the V group atomic mono layer in the second semiconductor layer being reversed with respect to that of the first semiconductor layer, in that more than one of the unit layer is stratified periodically, and in that the number or a thickness of the atomic mono layers in the first semiconductor layer is equal to the number or thickness of the atomic mono layers in the second semiconductor layer.

Figure 1:
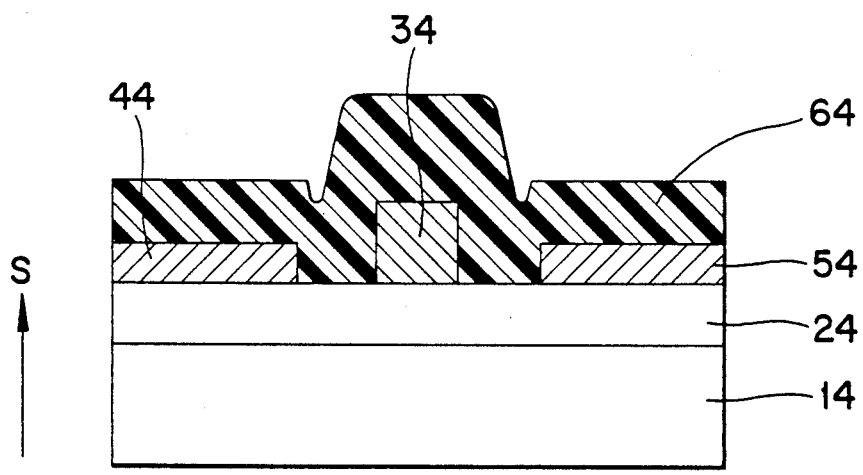
FIG. 1 is an illustrative cross sectional view showing the conventional GaAs MESFET.
Figure 2:
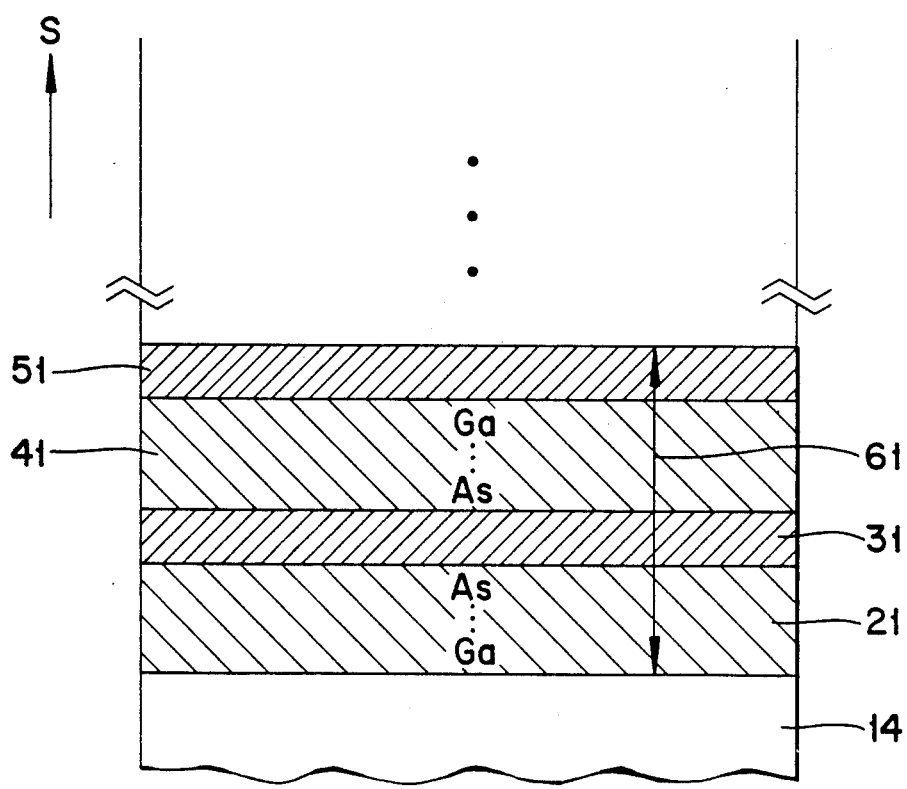
FIG. 2 is an illustrative cross sectional view showing a crystalline structure according to the first embodiment of the present invention for a GaAs MESFET substrate.

FIG. 2 is an illustrative cross sectional view showing a crystalline structure of a GaAs MESFET substrate according to the first embodiment of the present invention.

EXAMPLE 1

The crystalline structure shown in FIG. 2 can be prepared, for example by the following growing technique:

In a molecular beam epitaxy (MBE) unit equipped with a control mechanism including shutters for controlling molecular fluxes, a semi-insulating (100) GaAs substrate is held on a holder and is heated at a substrate temperature of 650° C. in an ultrahigh-vacuum chamber. At first, only one atomic mono layer of Ga is deposited on a surface of the semi-insulating (100) GaAs substrate. After a shutter for Ga effusion is closed to arrest a flux of Ga, only one atomic mono layer of As is deposited on the Ga atomic mono layer. The atomic layer epitaxy (ALE) can be realized by repeating such operations so that the growth is effected one atomic mono layer at a time. In the case shown in FIG. 2, each unit semiconductor layer 61 has a thickness of 67.8 Å and consists of a first GaAs layer 21 consisting of twenty (20) atomic mono layers which are formed by the ALE technique and are deposited alternately in the order of Ga-As, a first Ge layer 31 whose thickness corresponds to four (4) atomic mono layers of Ge and which is grown by irradiating the flux of Ge continuously, a second GaAs layer 41 consisting of twenty (20) atomic mono layers which are grown by the same manner as the first layer 21 except that the order of deposition is As-Ga, and a second Ge layer 51 whose thickness corresponds to four (4) atomic mono layers of Ge, and seventy (70) unit semiconductor layers 61 are stratified to have a thickness of 0.47 μm finally. In every unit semiconductor layer, the polarization is cancelled since the direction of polarization in the first GaAs is [111] while the direction of polarization in the second GaAs layer is [$\bar{1}\bar{1}\bar{1}$].

The first Ge layer 31 and the second Ge layer 51 are arranged because it is difficult to grow the second GaAs layer 41 directly on the first GaAs layer 21. Therefore, the number of atomic mono layers stratified in the Ge layer is not necessary to be large. It is also possible to use another element in IV group other than Ge since it is not necessary to take the continuity in the lattice into consideration when the number of atomic mono layers stratified in the Ge layer is small. The number of the atomic mono layers stratified in the Ge layer is preferably an even number in order to obtain an improved effect. Namely, when the number of the atomic mono layers stratified in the Ge layer is an odd number, a repetitive order of Ga and As and hence the polarity become identical both in the first GaAs layer and the second GaAs layer, so that such system can be considered that several atomic mono layers in the first GaAs layer are merely replaced by Ge atom monolayers. To the contrary, when the number of the atomic mono layers stratified in the Ge layer is an even number, a repetitive order of Ga and As becomes reversed in the first GaAs layer and the second GaAs layer.

In the case of a ternary compound semiconductor such as InGaAs, elements of III group such as In and Ga are deposited at a predetermined ratio of fluxes in place of a single flux of Ga. In this case also, a layer of IV group element which has the same function as the Ge layer can be deposited. In this case also, a layer of IV group element which has the same function as the Ge layer can be deposited.

EXAMPLE 2

Figure 3:
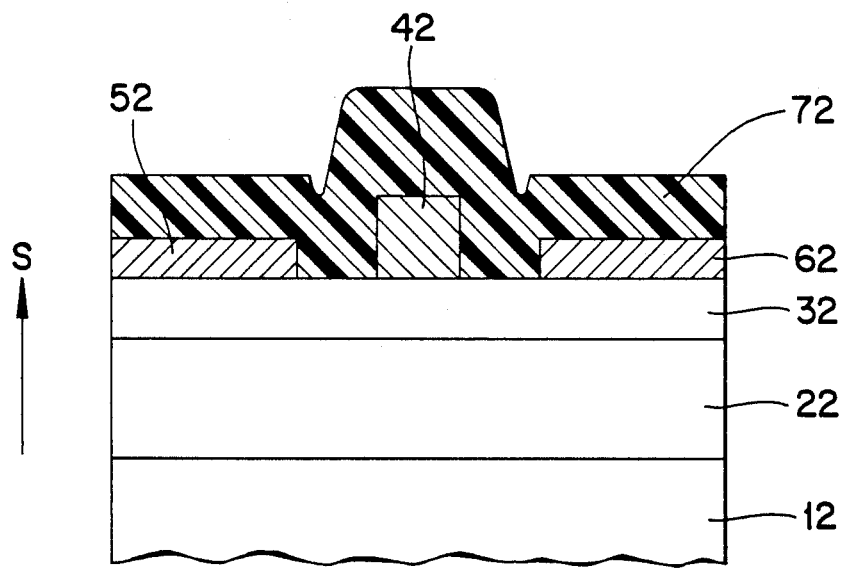
FIG. 3 shows a cross sectional view of an embodiment of a GaAs MESFET having the crystalline structure according to the present invention.

FIG. 3 shows a cross sectional view of an embodiment of a GaAs MESFET having the crystalline structure of FIG. 2. The above-mention crystalline structure 22 according to the present invention is deposited on a GaAs (100) substrate 12. Impurity is doped in a surface of the crystalline structure 22 to produce an active layer 32 having a thickness of 0.1 μm and a concentration of $2 \times 10^{17}$ cm$^{-3}$. A gate electrode 42, a source electrode 52 and a drain electrode 62 are formed on the active layer 32. A surface of the MESFET is covered with a protective overlay 72 composed of SiO$_2$ having a thickness of 1 μm.

According to the experiments which were conducted by the present inventor, in a case of a conventional MESFET whose gate length is 1 μm and which was prepared on a conventional (100) substrate under the same condition as Example 2, an anisotropy was observed in the FET performance. Namely, there was observed a difference in the threshold voltage of 180 mV between a [110] oriented FET and a [1$\bar{1}$0] oriented FET whose directions of the gates are perpendicular to each other.

To the contrary, no anisotropy was observed in the case of Example 2 and no deviation from a designed value. This means that the influence caused by the stress is removed.

EXAMPLE 3

Figure 4:
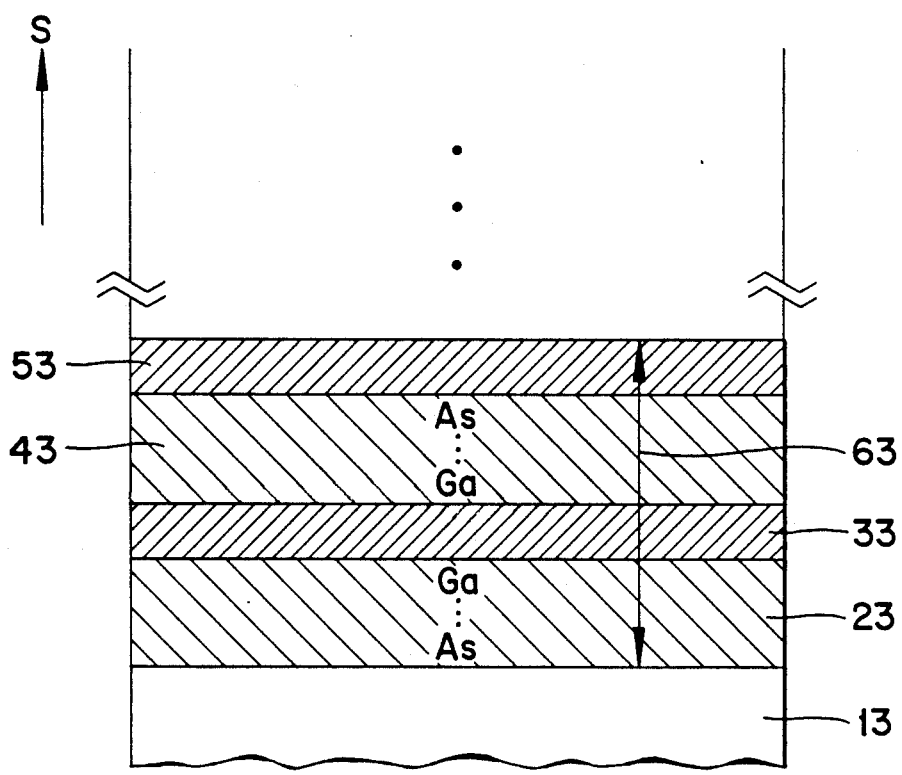
FIG. 4 is an illustrative cross sectional view which is similar to FIG. 2 but which shows another crystalline structure according to the present invention for the GaAs MESFET substrate.

FIG. 4 is an illustrative cross sectional view showing a crystalline structure for a GaAs MESFET substrate which is similar to FIG. 2 but shows another example of the first embodiment of the present invention.

The crystalline structure shown in FIG. 4 is prepared, for example, by the following growing technique:

In a molecular beam epitaxy unit equipped with a control mechanism including shutters for controlling molecular fluxes, a semi-insulating (100) GaAs substrate is held on a holder and is heated at a substrate temperature of 650° C. in an ultrahigh-vacuum chamber. At first, only one atomic mono layer of Ga is deposited on a surface of the semi-insulating (100) GaAs substrate. After a shutter for Ga effusion is closed to arrest a flux of Ga, only one atomic mono layer of As is deposited on the Ga atomic mono layer. The atomic layer epitaxy (ALE) can be realized by repeating such operations so that the growth is effected one atomic mono layer at a time. In the case shown in FIG. 4, each unit semiconductor layer 63 has a thickness of 96.1 Å and consists of a first GaAs layer 23 consisting of thirty (30) atomic mono layers which are formed by the ALE technique and are deposited laternately in the order of As-Ga, a first Ge layer 33 whose thickness corresponds to four (4) atomic mono layers of Ge and which is grown by irradiating the flux of Ge continuously, a second GaAs layer 43 consisting of thirty (30) atomic mono layers which are grown by the same manner as the first layer 23 except that the order of deposition is Ga-As, and a second Ge layer 53 whose thickness corresponds to four (4) atomic mono layers of Ge, and seventy (70) unit semiconductor layers 63 are stratified to a thickness of 0.67 μm. In every unit semiconductor layer, the polarization is cancelled since the direction of polarization in the first GaAs is [$\bar{1}\bar{1}\bar{1}$] while the direction of polarization in the second GaAs layer is [111].

Although the GaAs (100) substrate is used to produce the stratified structure shown in this first embodiment, the Ga layer, the As layer and the Ge layer can be stratified on the other substrate such as Ge (100) substrate, GaAs (111) substrate, Ge (111) substrate or the like in place of the GaAs (100) substrate.

In the invention, a superlattice structure of equal polarity can be realized in any polar crystal such as InP whose lattice constant is nearly the same and on which epitaxial growth can be effected, so that homogeneous devices which are free from anisotropy due to the polarity can be manufactured. Such superlattice structure having equal polarity can be realized when the crystalline structure according to the present invention is grown along the direction of [111] axis on the substrate.

The crystalline structure according to the present invention is applicable to any device of compound semiconductors such as hetero bipolar transistors (HBT), laser diodes or the like in addition to the GaAs MESFET shown in the embodiment. Thus, the first embodiment has a wide applications because the structure can suppress the deviation or shift caused by the stress.

It is apparent from the above-stated description that the crystalline structure according to the first embodiment has such an advantage that the anisotropy caused by the polarization can be eliminated, so that, for example, the dependency of threshold voltage on the gate orientation caused by piezoelectric effect due to the stress in GaAs MESFET can be eliminated and hence the freedom in design of integrated circuits is increased and the fluctuation of characteristics can be reduced, so that uniformity in FET electrical characteristics is improved.

SECOND PREFERRED EMBODIMENT

In the second embodiment of the semiconductor crystal which is provided by the second aspect of the present invention, the anisotropy caused by the polarization is controlled intentionally in order to control, for example, the short-channel effect by means of the piezoelectric charges caused by the stress in GaAsMESFET.

The principle on which the second embodiment of the present invention is based is such a fact that the polarity in the unit layer is offset when the thickness of the first semiconductor layer is equal to the thickness of the second semiconductor layer, since polarization sign in the first semiconductor layer is directed to [111] while polarization sign in the second semiconductor layer is directed to [$\bar{1}\bar{1}\bar{1}$], and hence, the value of piezoelectric polarization remained in the unit semiconductor layer is determined by a difference in thickness between the first semiconductor layer and the second semiconductor layer. In other words, the value of piezoelectric polarizations can be controlled continuously by changing a ratio of the thickness of the first semiconductor layer to that of the second semiconductor layer. This means that a desired piezoelectric charge can be generated under a condition that the thickness of the protective overlay is constant. Therefore, the carriers are well-trapped in the channel to improve the FET performance.

A semiconductor crystal according to the second embodiment has a structure in which more than one unit layer stratified periodically comprises a first semiconductor layer deposited on a substrate and consisting of at least one layer comprising III group atomic mono layer and V group atomic mono layer which are stratified alternately along the direction of [111] axis, the III group atomic and the V gruop atom being components of a III-V compound semiconductor having a zincblende type crystal, and a second semiconductor layer deposited on the first semiconductor layer and consisting of at least one layer comprising alternately stratified III group atomic mono layer and V group atomic mono layer, the order of stratification of the III group atomic mono layer and the V group atomic mono layer in the second semiconductor layer being reversed with respect to that of the first semiconductor layer, and wherein a ratio of the number or a thickness of said atomic mono layers in the first semiconductor layer to the number or a thickness of said atomic mono layers in the second semiconductor layer is an any number except 1.

The structure of the semiconductor crystal according to the second embodiment is similar to that of the first embodiment except that the ratio of the number or thickness of the atomic mono layers in the first semiconductor layer to the number or a thickness of the atomic mono layers in the second semiconductor layer is an any number except 1.

EXAMPLE 4

In this Example 4, a GaAs MESFET substrate which is similar to Example 1 shown in FIG. 2 is prepared by repeating the same process as Example 1 except the following points:

(1) The semi-insulating (100) GaAs substrate 14 is changed to a semi-insulating (111) GaAs substrate 14.

(2) Each unit semiconductor layer 61 consists of thirty eight (38) atomic mono layers comprising a first GaAs layer 21 consisting of twenty (20) atomic mono layers which are formed by the ALE technique and are deposited alternately in the order of Ga-As, a first Ge layer 31 whose thickness corresponds to four (4) atomic mono layers of Ge and which is grown by irradiating the flux of Ge continuously, a second GaAs layer 41 consisting of ten (10) atomic mono layers which are grown by the same manner as the first layer 21 except that the order of deposition is As-Ga, and a second Ge layer 51 whose thickness corresponds to four (4) atomic mono layers of Ge. And hence, seventy (70) unit semiconductor layers 61 are stratified finally.

Therefore, when tensile stress is exerted along [111] direction, a part of the polarization which corresponds to ten (10) atomic mono layers of Ga and As in each unit semiconductor layer is cancelled, since the direction of polarization in the first GaAs is [111] while the direction of polarization in the second GaAs layer is [$\bar{1}\bar{1}\bar{1}$] which is opposite to [111]. In other words, the value of polarization caused by the stress, namely the piezoelectric charge is reduced by the cancelled thickness, or reduced to one third of the conventional GaAs substrate in which the directions of polarization are not cancelled, since the thickness of Ge can be negligible.

EXAMPLE 5

In this Example 5, GaAs MESFET substrate which is similar to Example 2 shown in FIG. 3 is prepared by repeating the same process as Example 2 except the following points:

(1) The GaAs (100) substrate 12 is replaced by a GaAs (111) substrate 12.

(2) The gate length is changed to 0.5 μm.

According to the experiments which are conducted by the present inventor, in a case of the conventional MESFET which has a gate length of 0.5 μm and which was prepared on a conventional (111) substrate under the same condition as Example 5, the threshold voltage observed shift at 350 mV from the designed value.

To the contrary, in the case of Example 5, it was found that the threshold value can be changed within about ±200 mV from a mid point when the ratio of the thickness of the first semiconductor layer to that of the second semiconductor layer is changed.

EXAMPLE 6

In this Example 6, a GaAs MESFET substrate which is similar to Example 3 shown in FIG. 4 is prepared by repeating the same process as Example 3 except the following points:

(1) The GaAs (100) substrate 13 is replaced by a GaAs (111) substrate 13.

(2) In the case Example 6, each unit semiconductor layer 63 consists of a first GaAs layer 23 consisting of twenty (20) atomic mono layers which are formed by the ALE technique and are deposited alternately in the order of As-Ga, a first Ge layer 33 whose thickness corresponds to four (4) atomic mono layers of Ge and which is grown by irradiating the flux of Ge continuously, a second GaAs layer 43 consisting of ten (10) atomic mono layers which are grown by the same manner as the first layer 23 except that the order of deposition is Ga-As, and a second Ge layer 53 whose thickness corresponds to four (4) atomic mono layers of Ge, and seventy (70) unit semiconductor layers 63 are stratified Therefore, when tensile stress is exerted along [111] direction, a part of the polarization which corresponds to ten (10) atomic layers of Ga and As in each unit semiconductor layer is cancelled, since the direction of polarization in the first GaAs is [$\bar{1}\bar{1}\bar{1}$] while the direction of polarization in the second GaAs layer is [111] which is opposite to [$\bar{1}\bar{1}\bar{1}$]. In other words, the value of polarization caused by the stress, namely the piezoelectric charge is reduced by the cancelled thickness, namely reduced to one third of the conventional GaAs substrate in which the directions of polarization are not cancelled, since the thickness of Ge can be negligible.

Although the GaAs (111) substrate is used to produce the stratified structure shown in this example, the Ga atomic mono layer, the As atomic mono layer and the Ge atomic mono layer can be stratified on the other substrate such as Ge (111) substrate in place of the GaAs (111) substrate.

According to the present invention, a superlattice structure whose polarity is controlled can be realized in any polar crystal such as InP whose lattice constant is nearly the same and on which epitaxial growth can be effected, so that the device performance can be improved by controlling the anisotropy due to the polarity.

The crystalline structure according to the present invention is applicable to any device of compound semiconductors such as hetero bipolar transistors (HBT), laser diodes or the like in addition to the GaAs MESFET shown in the embodiment. Thus, the present invention has a wide applications because the design flexibility can be increased by controlling the electric characteristics caused by the stress.

THIRD PREFERRED EMBODIMENT

In the third embodiment of the semiconductor crystal which is provided by the third aspect of the present invention, the anisotropic effect caused by polarization can be controlled continuously. For example, the design flexibility of GaAsMESFET which utilize the piezoelectric effect caused by the stress in order to obtain two different threshold voltages each depend on the difference in the orientation of respective gates is advantageously increased.

The principle on which the third embodiment of the present invention is based is basically the same as the second embodiment.

A semiconductor crystal according to the third embodiment has a structure in which more than one unit layer stratified periodically, each unit layer comprising a first semiconductor layer deposited on a substrate and consisting of at least one layer comprising III group atomic mono layer and V group atomic mono layer which are stratified alternately along the direction of [100] axis, the III group atomic and the V group atomic being components of a III-V compound semiconductor having a zincblende type crystal, and a second semiconductor layer deposited on the first semiconductor layer and consisting of at least one layer comprising alternately stratified III group atomic mono layer and V group atomic mono layer, the order of stratification of the III group atomic mono layer and the V group atomic mono layer in the second semiconductor layer being reversed with respect to that of the first semiconductor layer, wherein a ratio of the number or a thickness of the atomic mono layers in the first semiconductor layer to the number or a thickness of the atomic mono layers in the second semiconductor layer is an any number except 1.

The structure of the semiconductor crystal according to the third embodiment is similar to that of the first embodiment except that the ratio of the number or a thickness of the atomic mono layers in the first semiconductor layer to the number or a thickness of the atomic mono layers in the second semiconductor layer is an any number except 1.

EXAMPLE 7

In this Example 7, a GaAs MESFET substrate which is similar to Example 1 shown in FIG. 2 is prepared by repeating the same process as Example 1 except the following point:

Each unit semiconductor layer 61 consists of thirty eight (38) atomic mono layers comprising a first GaAs layer 21 consisting of twenty (20) atomic mono layers which are formed by the ALE technique and are deposited alternately in the order of Ga-As, a first Ge layer 31 whose thickness corresponds to four (4) atomic mono layers of Ge and which is grown by irradiating the flux of Ge continuously, a second GaAs layer 41 consisting of ten (10) atomic mono layers which are grown by the same manner as the first layer 21 except that the order of deposition is As-Ga, and a second Ge layer 51 whose thickness corresponds to four (4) atomic mono layers of Ge. Finally, seventy (70) unit semiconductor layers 61 are stratified.

In this structure, when tensile stress is exerted along [111] direction, a part of the polarization which corresponds to ten (10) atomic layers of Ga and As in each unit semiconductor layer is cancelled, since the direction of polarization in the first GaAs is {$\bar{1}\bar{1}\bar{1}$} while the direction of polarization in the second GaAs layer is [111] which is opposite to {$\bar{1}\bar{1}\bar{1}$}. In other words, the value of polarization caused by the stress, namely the piezoelectric charge is reduced in proportion to the portion of thickness cancelled, namely reduced to one third of the conventional GaAs substrate in which the directions of polarization are not cancelled. In this case, the thickness of Ge is negligible.

EXAMPLE 8

In this Example 8, GaAs MESFET substrate which is similar to Example 2 shown in FIG. 3 is prepared by repeating the same process as Example 2 except the gate length is changed to 0.5 μm.

According to the experiments which are conducted by the present inventor, in a case of the conventional MESFET which has a gate length of 0.5 μm and which was prepared on a (100) substrate under the same condition as Example 8, the conventional anisotropic property in FET was observed. Namely, a difference in threshold voltage observed between two gates one of which is directed to [110] and the other of which is directed to [1$\bar{1}$0] which are perpendicular to each other was 480 mV.

To the contrary, in the case of the Example 8 of the present invention, the difference in threshold value was 150 mV.

EXAMPLE 9

In this Example 9, a GaAs MESFET substrate which is similar to Example 3 shown in FIG. 4 is prepared by repeating the same process as Example 3 except the following point:

In the Example 9, each unit semiconductor layer 63 consists of a first GaAs layer 23 consisting of twenty (20) atomic mono layers which are formed by the ALE technique and are deposited alternately in the order of As-Ga, a first Ge layer 33 whose thickness corresponds to four (4) atomic mono layers of Ge and which is grown by irradiating the flux of Ge continuously, a second GaAs layer 43 consisting of ten (10) atomic mono layers which are grown by the same manner as the first layer 23 except that the order of deposition is Ga-As, and a second Ge layer 53 whose thickness corresponds to four (4) atomic mono layers of Ge, and finally seventy (70) unit semiconductor layers 63 are stratified.

Therefore, when tensile stress is exerted along [111] direction, a part of the polarization which correspond to ten (10) atomic layers of Ga and As in each unit semiconductor layer is cancelled, since the direction of polarization in the first GaAs is [111] while the direction of polarization in the second GaAs layer is [$\bar{1}\bar{1}\bar{1}$] which is opposite to [111]. In other words, the value of polarization caused by the stress, namely the piezoelectric charge is reduced by the cancelled thickness, namely reduced to one third of the conventional GaAs substrate in which the directions of polarization are not cancelled. In this case, the thickness of Ge is negligible.

Although the GaAs (100) substrate is used to produce the stratified structure shown in this example, the Ga layer, the As layer and the Ge layer can be stratified on the other substrate such as Ge (100) substrate in place of the GaAs (100) substrate.

The intermediate Ge layer can be replaced by another intermediate layer such as a silicon (Si) intermediate layer.

The structure of the present invention is applicable to any polar crystal such as InP, InAs, GaP, InGaAs, InAsGaP or the like composed of atomic mono layers having nearly equal lattice constants and which can be produced by epitaxial growing technique so as to utilize the anisotropy caused by the polarity.

The crystalline structure according to the present invention is applicable to any device of compound semiconductors such as hetero bipolar transistors (HBT), laser diodes or the like in addition to the GaAs MESFET shown in the embodiment. The present invention has a wide applications for moderating electric characteristics caused by the stress.

What is claimed is:

1. A semiconductor crystal of compound semiconductor material composed of a first element and a second element, comprising:
   a plurality of unit layers stratified periodically on a substrate,
   each of said unit layers having at least one first semiconductor layer consisting of a first atomic monolayer of said first element and a second atomic monolayer of said second element, said first and second atomic monolayers being stratified one over another alternately in a first deposition order, and at least one second semiconductor layer consisting of said first atomic monolayer and said second atomic monolayer which are stratified one over another alternately in the reverse deposition order with respect to the first deposition order of the first semiconductor layer, and
   the total number of said first and second atomic monolayers in said first semiconductor layer being equal to the total number of said first and second atomic monolayers in said second semiconductor layer.

2. A semiconductor crystal of compound semiconductor material composed of a first element and a second element, comprising:
   a plurality of unit layers stratified periodically on a substrate,
   each of said unit layers having at least one first semiconductor layer consisting of a first atomic monolayer of said first element and a second atomic monolayer of said second element, said first and second atomic monolayers being stratified one over another alternately in a first deposition order, and at least one second semiconductor layer consisting of said first atomic monolayer and said second atomic monolayer which are stratified one over another alternately in the reverse deposition order with respect to the first deposition order of the first semiconductor layer, and
   the total number of said first and second atomic monolayers in said first semiconductor layer being not equal to the total number of said first and second atomic monolayers in said second semiconductor layer.

3. A semiconductor crystal set forth in claim 2, characterized in that said unit layers are stratified periodically along a direction of a first axis on said substrate.

4. A semiconductor crystal set forth in claim 2, characterized in that said unit layers are stratified periodically along a direction of a second axis on said substrate.

5. A semiconductor crystal of compound semiconductor material composed of a first element and a second element, comprising:
   a plurality of unit layers stratified periodically on a substrate,
   each of said unit layers having at least one first semiconductor layer consisting of a first atomic monolayer of said first element and a second atomic monolayer of said second element, said first and second atomic monolayers being stratified one over another alternately in a first deposition order, and at least one second semiconductor layer consisting of said first atomic monolayer and said second atomic monolayer which are stratified one over another alternately in the reverse deposition order with respect to the first deposition order of the first semiconductor layer, and
   an intermediate layer being interposed between said first semiconductor layer and said second semiconductor layer.

6. A semiconductor crystal set forth in claim 5, characterized in that each of said intermediate layer comprises a plurality of atomic monolayers.

7. A semiconductor crystal set forth in claim 6, characterized in that the number of said atomic monolayer in said intermediate layer is an even number.

8. A semiconductor crystal of III-V compound semiconductor material composed of a III-group element and a V-group element, comprising a plurality of unit layers stratified periodically on a substrate, each of said unit layers having at least one first semiconductor layer consisting of a first atomic monolayer of III-group element and a second atomic monolayer of V-group element, said first and second atomic monolayers being stratified one over another alternately in a first deposition order, and at least one second semiconductor layer consisting of said first atomic monolayer and said second atomic monolayer which are stratified one over another alternately in the reverse deposition order with respect to the first deposition order of the first semiconductor layer.

9. A semiconductor cyrstal set forth in claim 8, characterized in that the III-group element is Ga and the V-group element is As.

10. A semiconductor crystal of compound semiconductor material composed of a first element and a second element and having a zincblende type crystal structure, comprising a plurality of unit layers stratified periodically on a substrate, each of said unit layers having at least one first semiconductor layer consisting of a first atomic monolayer of said first element and a second atomic monolayer of said second element, said first and second atomic monolayers being stratified one over another alternately in a first deposition order, and at least one second semiconductor layer consisting of said first atomic monolayer and said second atomic monolayer which are stratified one over another alternately in the reverse deposition order with respect to the first deposition order of the first semiconductor layer.

* * * * *